(12) United States Patent
Donofrio

(10) Patent No.: US 7,419,912 B2
(45) Date of Patent: Sep. 2, 2008

(54) LASER PATTERNING OF LIGHT EMITTING DEVICES

(75) Inventor: Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 222 days.

(21) Appl. No.: 10/815,293

(22) Filed: Apr. 1, 2004

(65) Prior Publication Data

US 2005/0227379 A1    Oct. 13, 2005

(51) Int. Cl.
*H01L 21/311* (2006.01)
*B29D 11/00* (2006.01)
*G03F 1/00* (2006.01)

(52) U.S. Cl. .................. 438/694; 438/700; 438/780; 438/940; 216/24; 216/41; 430/5; 430/32

(58) Field of Classification Search ................. None
See application file for complete search history.

(56) References Cited

U.S. PATENT DOCUMENTS

| | | | | |
|---|---|---|---|---|
| 3,954,534 | A | * 5/1976 | Scifres et al. | 438/29 |
| 4,545,366 | A | 10/1985 | O'Neill | 126/440 |
| 4,672,949 | A | 6/1987 | O'Neill | 126/700 |
| 4,711,972 | A | 12/1987 | O'Neill | 136/246 |
| 4,719,904 | A | 1/1988 | O'Neill | 126/650 |
| 4,915,981 | A | * 4/1990 | Traskos et al. | 219/121.7 |
| 4,918,497 | A | 4/1990 | Edmond | 357/17 |
| 4,966,862 | A | 10/1990 | Edmond | 437/100 |
| 5,027,168 | A | 6/1991 | Edmond | 357/17 |
| 5,087,535 | A | * 2/1992 | Hirokane et al. | 430/5 |
| 5,210,051 | A | 5/1993 | Carter, Jr. | 437/107 |

(Continued)

FOREIGN PATENT DOCUMENTS

EP    1 263 058    12/2002

(Continued)

OTHER PUBLICATIONS

Boehlen et al., "Laser Micro-Machining of High Density Optical Structures on Large Substrates, " Exitech Ltd, Oxford Industrial Park, 10 pages.

(Continued)

*Primary Examiner*—Alonzo Chambliss
(74) *Attorney, Agent, or Firm*—Myers Bigel Sibley & Sajovec

(57) ABSTRACT

Light extraction features are provided for a light emitting device having a substrate and a semiconductor light emitting element on the substrate by shaping a surface of a layer of semiconductor material utilizing a laser to define three dimensional patterns in the layer of semiconductor material. The layer of semiconductor material may be the substrate. In particular embodiments of the present invention, the surface of the layer of semiconductor material is shaped by applying laser light to the layer of semiconductor material at an energy sufficient to remove material from the layer of semiconductor material. The laser light may also by applied in a blanket manner at a level below the ablation threshold. The application of laser light to the layer of semiconductor material may be followed by etching the substrate. The layer of semiconductor material may be anisotropically etched. A mask could also be patterned utilizing laser light and the layer of semiconductor material etched using the mask. Light emitting devices have three dimensional patterns in a layer of semiconductor material of the device are also provided.

9 Claims, 9 Drawing Sheets

U.S. PATENT DOCUMENTS

| | | | |
|---|---|---|---|
| 5,210,766 A | 5/1993 | Winer et al. | 372/40 |
| 5,338,944 A | 8/1994 | Edmond et al. | 257/76 |
| 5,393,993 A | 2/1995 | Edmond et al. | 257/77 |
| 5,416,342 A | 5/1995 | Edmond et al. | 257/76 |
| 5,498,297 A | 3/1996 | O'Neill et al. | 136/246 |
| 5,505,789 A | 4/1996 | Fraas et al. | 136/246 |
| 5,523,589 A | 6/1996 | Edmond et al. | 257/77 |
| 5,604,135 A | 2/1997 | Edmond et al. | 437/22 |
| 5,631,190 A | 5/1997 | Negley | 438/33 |
| 5,739,554 A | 4/1998 | Edmond et al. | 257/103 |
| 5,779,924 A * | 7/1998 | Krames et al. | 216/24 |
| 5,793,062 A | 8/1998 | Kish, Jr. et al. | 257/98 |
| 5,912,477 A | 6/1999 | Negley | 257/95 |
| 6,031,179 A | 2/2000 | O'Neill | 136/246 |
| 6,075,200 A | 6/2000 | O'Neill | 136/246 |
| 6,111,190 A | 8/2000 | O'Neill | 136/246 |
| 6,120,600 A | 9/2000 | Edmond et al. | 117/89 |
| 6,177,688 B1 | 1/2001 | Linthicum et al. | 257/77 |
| 6,187,606 B1 | 2/2001 | Edmond et al. | 438/46 |
| 6,201,262 B1 | 3/2001 | Edmond et al. | 257/77 |
| 6,393,685 B1 * | 5/2002 | Collins | 29/416 |
| 6,410,348 B1 | 6/2002 | Chen et al. | 438/9 |
| 6,410,942 B1 | 6/2002 | Thibeault et al. | |
| 6,483,196 B1 | 11/2002 | Wojnarowski et al. | 257/778 |
| 6,504,180 B1 | 1/2003 | Heremans et al. | 257/98 |
| 6,639,931 B1 * | 10/2003 | Dowd et al. | 372/96 |
| 6,657,236 B1 * | 12/2003 | Thibeault et al. | 257/98 |
| 6,784,512 B2 * | 8/2004 | Yamaguchi et al. | 257/440 |
| 6,821,804 B2 | 11/2004 | Thibeault et al. | |
| 6,943,117 B2 * | 9/2005 | Jeong et al. | 438/694 |
| 7,250,635 B2 | 7/2007 | Lee et al. | |
| 2002/0123164 A1 | 9/2002 | Slater, Jr. et al. | 438/39 |
| 2003/0006418 A1 | 1/2003 | Emerson et al. | 257/79 |
| 2004/0056260 A1 | 3/2004 | Slater, Jr. et al. | 257/79 |
| 2005/0151138 A1 | 7/2005 | Slater, Jr. et al. | 257/79 |
| 2005/0227379 A1 | 10/2005 | Donofrio | 438/4 |
| 2006/0269853 A1 * | 11/2006 | Yang | 430/5 |
| 2007/0080365 A1 * | 4/2007 | Watanabe | 257/103 |

FOREIGN PATENT DOCUMENTS

| | | |
|---|---|---|
| EP | 1 263 058 A2 | 5/2005 |
| WO | WO 02/14362 | 5/2002 |
| WO | WO 02/41362 A2 | 5/2002 |
| WO | WO 02/41362 A3 | 5/2002 |
| WO | WO 02/073705 A2 | 9/2002 |
| WO | WO 03/017385 | 2/2003 |
| WO | WO 2005/104253 A1 | 11/2005 |

OTHER PUBLICATIONS

Craford, *Overview of Device Issues in High-Brightness Light-Emitting Diodes*, Chapter 2, *High Brightness Light Emitting Diodes: Semiconductors and Semimetals*, vol. 48, Stringfellow et al. ed., Academic Press, 1997, pp. 47-63.

Köck et al., "Strongly Directional Emission from AlGaAs/GaAs Light Emitting Diodes," *Applied Physics Letter,* 57(22): 2327-2329 (Nov. 26, 1990).

Krames et. al., "High Power Truncated-Inverted-Pyramid ($Al_x Ga_{1-x}$)$_{0.5}In_{0.5}$P/GaP Light-Emitting Diodes Exhibiting >50% External Qauntum Efficiency," *Applied Physics Letters,* 75(16): 2365-2367 (Oct. 18, 1999).

Shnitzer et al., "30% External Quantum Efficiency from Surface Textured, Thin-Film Light Emitting Diodes," *Applied Physics Letters,* 63(16): 2174-2176 (Oct. 18, 1993).

Shnitzer et al., "Ultrahigh Spontaneous Emission Quantum Efficiency. 99.7% Internally and 72% Externally, from AlGaAs/GaAs/AlGaAs Double Heterostructures," *Applied Physics Letters,* 62(2): 131-133 (Jan. 11, 1993).

International Search Report for International patent application No. PCT/US2005/001933 mailed on Aug. 6, 2005.

Written Opinion of the International Searching Authority for International patent application No. PCT/US2005/001933 mailed on Aug. 6, 2005.

Yamada et al. "InGaN-Based Near-Ultraviolet and Blue-Light-Emitting Diodes with High External Quantum Efficiency Using a Patterned Sapphire Substrate and a Mesh Electrode" *Jpn J Appl Phys* vol. 41 pt. 2 No. 12b, pp. L1431-L1433 (2002).

Pan et al. "Improvement of InGaN-GaN Light-Emitting Diodes with Surface-Textured Indium-Tin-Oxide Transparent Ohmic Contacts," *IEEE Photonics Technology Letters,* vol. 15, No. 5, May 2003.

Shafeev et al. "Uncongruent laser ablation and electroless metallization of SiC," *Applied Physics Letters,* vol. 68, No. 6, Feb. 5, 1996.

International Search Report and Written Opinion of the International Searching Authority for corresponding PCT application No. PCT/US2005/001933, issued Jul. 19, 2006.

* cited by examiner

LASER PATTERNING OF LIGHT EMITTING DEVICES

FIELD OF THE INVENTION

This invention relates to semiconductor light emitting devices and fabricating methods therefor.

BACKGROUND OF THE INVENTION

Semiconductor light emitting devices, such as Light Emitting Diodes (LEDs) or laser diodes, are widely used for many applications. As is well known to those having skill in the art, a semiconductor light emitting device includes a semiconductor light emitting element having one or more semiconductor layers that are configured to those having skill in the art, a light emitting diode or laser diode, generally includes a diode region on a microelectronic substrate. The microelectronic substrate may be, for example, gallium arsenide, gallium phosphide, alloys thereof, silicon carbide and/or sapphire. Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

One measure of efficiency of LEDs is the cost per lumen. The cost per lumen for an LED may be a function of the manufacturing cost per LED chip, the internal quantum efficiency of the LED material and the ability to couple or extract the generated light out of the device. An overview of light extraction issues may be found in the textbook entitled *High Brightness Light Emitting Diodes* to Stringfellow et al., Academic Press, 1997, and particularly Chapter 2, entitled *Overview of Device Issues in High-Brightness Light Emitting Diodes*, to Craford, at pp. 47-63.

Much development interest and commercial activity recently has focused on LEDs that are fabricated in or on silicon carbide, because these LEDs can emit radiation in the blue/green portions of the visible spectrum. See, for example, U.S. Pat. No. 5,416,342 to Edmond et al., entitled *Blue Light-Emitting Diode With High External Quantum Efficiency*, assigned to the assignee of the present application, the disclosure of which is hereby incorporated herein by reference in its entirety as if set forth fully herein. There also has been much interest in LEDs that include gallium nitride-based diode regions on silicon carbide substrates, because these devices also may emit light with high efficiency. See, for example, U.S. Pat. No. 6,177,688 to Linthicum et al., entitled *Pendeoepitaxial Gallium Nitride Semiconductor Layers On Silicon Carbide Substrates*, the disclosure of which is hereby incorporated herein by reference in its entirety as if set forth fully herein.

The efficiency of conventional LEDs may be limited by their inability to emit all of the light that is generated by their active layer. When an LED is energized, light emitting from its active layer (in all directions) reaches the emitting surfaces at many different angles. Typical semiconductor materials have a high index of refraction (n~2.2-3.8) compared to ambient air (n=1.0) or encapsulating epoxy (n~1.5). According to Snell's law, light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). In the case of an LED, the TIR light can continue to be reflected within the LED until it is absorbed. Because of this phenomenon, much of the light generated by conventional LEDs does not emit, degrading its efficiency.

Light extraction has been accomplished in many ways, depending, for example, on the materials that are used to fabricate the diode region and the substrate. For example, in gallium arsenide and gallium phosphide material systems, a thick, p-type, topside window layer may be used for light extraction. The p-type window layer may be grown because high epitaxial growth rates may be possible in the gallium arsenide/gallium phosphide material systems using liquid and/or vapor phase epitaxy. Moreover, current spreading may be achieved due to the conductivity of the p-type topside window layer. Chemical etching with high etch rates and high etch selectivity also may be used to allow the removal of at least some of the substrate if it is optically absorbent. Distributed Bragg reflectors also have been grown between an absorbing substrate and the diode region to decouple the emitting and absorbing regions.

One method of reducing the percentage of TIR light and, thereby increasing the efficiency of the LED, is to create light scattering centers in the form of random texturing on the LED's surface. See Shnitzer, et al., "30% External Quantum Efficiency From Surface Textured, Thin Film Light Emitting Diodes", Applied Physics Letters 63, Pgs. 2174-2176 (1993). The random texturing is patterned into the surface by using sub micron diameter polystyrene spheres on the LED surface as a mask during reactive ion etching. The textured surface has features on the order of the wavelength of light that refract and reflect light in a manner not predicted by Snell's law due to random interference effects.

Another method of increasing light extraction from an LED is to include a periodic patterning of the emitting surface or internal interfaces which redirects the light from its internally trapped angle to defined modes determined by the shape and period of the surface. See U.S. Pat. No. 5,779,924 to Krames et at.

An increase in light extraction has also been realized by shaping the LED's emitting surface into a hemisphere with an emitting layer at the center. U.S. Pat. No. 3,954,534 to Scifres and Burnham discloses a method of forming an array of LEDs with a respective hemisphere above each of the LEDs. The hemispheres are formed in a substrate and a diode array is grown over them. The diode and lens structure is then etched away from the substrate.

U.S. Pat. No. 5,793,062 discloses a structure for enhancing light extraction from an LED by including optically non-absorbing layers to redirect light away from absorbing regions such as contacts, and also to redirect light toward the LED's surface.

Another way to enhance light extraction is to couple photons into surface plasmon modes within a thin film metallic layer on the LED's emitting surface, which are emitted back into radiated modes. See Köck et al., Strongly Directional Emission From AlGaAs/GaAs Light Emitting Diodes, Applied Physics Letter 57, Pgs. 2327-2329 (1990). These structures rely on the coupling of photons emitted from the semiconductor into surface plasmons in the metallic layer, which are further coupled into photons that are finally extracted.

Light extraction can also be improved by angling the LED chip's side surfaces to create an inverted truncated pyramid. The angled surfaces provide the TIR light trapped in the substrate material with an emitting surface See Krames, et. al., High Power Truncated Inverted Pyramid ($Al_x Ga_{1-x}$)$_{0.5}$ $In_{0.5}P/GaP$ Light Emitting Diodes Exhibiting>50% External Qauntum Efficiency, Applied Physics Letters 75 (1999).

Still another approach for enhancing light extraction is photon recycling Shnitzer, et al., "Ultrahigh Spontaneous Emission Quantum Efficiency, 99.7% Internally and 72% Externally, From AlGaAs/GaAs/AlGaAs Double Heterostructures", Applied Physics Letters 62, Pgs. 131-133 (1993). This method relies on LEDs having a high efficiency active layer that readily converts electrons and holes to light and vice versa. TIR light reflects off the LED's surface and strikes the active layer, where it is converted back to an electron-hole pair. Because of the high efficiency of the active layer, the electron-hole pair will almost immediately be reconverted to light that is again emitted in random directions. A percentage of the recycled light will strike one of the LEDs emitting surfaces within the critical angle and escape. Light that is reflected back to the active layer goes through the same process again.

U.S. Pat. No. 6,657,236, the disclosure of which is incorporated herein as if set forth in its entirety, describes the use of light extraction structures on or within the LED to increase its efficiency. The light extraction structures provide surfaces for reflecting, refracting or scattering light into directions that are more favorable for the light to escape into the package. The structures can be arrays of light extraction elements or disperser layers. The light extraction elements can have many different shapes and are placed in many locations to increase the efficiency of the LED over conventional LEDs. The disperser layers provide scattering centers for light and can be placed in many locations as well. LEDs with arrays of light extraction elements are fabricated with standard processing techniques. Techniques for the manufacture of LEDs with disperser layers are also described.

Published United States Patent Application No. 2002/0123164, the disclosure of which is incorporated herein as if set forth in its entirety, describes light emitting diodes that include a substrate having first and second opposing faces and that is transparent to optical radiation in a predetermined wavelength range and that is patterned to define, in cross-section, a plurality of pedestals that extend into the substrate from the first face towards the second face. A diode region on the second face is configured to emit light in the predetermined wavelength range, into the substrate upon application of voltage across the diode region. A mounting support on the diode region, opposite the substrate is configured to support the diode region, such that the light that is emitted from the diode region into the substrate, is emitted from the first face upon application of voltage across the diode region. The first face of the substrate may include therein a plurality of grooves that define the plurality of triangular pedestals in the substrate. The grooves may include tapered sidewalls and/or a beveled floor. The first face of the substrate also may include therein an array of via holes. The via holes may include tapered sidewalls and/or a floor.

SUMMARY OF THE INVENTION

Some embodiments of the present invention provide for forming light extraction features for a light emitting device that includes a substrate and a semiconductor light emitting element on the substrate by shaping a surface of a layer of semiconductor material of the light emitting device utilizing a laser to define three dimensional geometric patterns in the layer of semiconductor material. In particular embodiments of the present invention, the surface of the layer of semiconductor material is shaped by applying laser light to the layer of semiconductor material at an energy sufficient to remove material from the layer of semiconductor material. The application of laser light to the layer of semiconductor material may be followed by etching the layer of semiconductor material. The layer of semiconductor material may be anisotropically etched.

In particular embodiments of the present invention, the layer of semiconductor material is the substrate. In other embodiments of the present invention, the layer of semiconductor material is a layer of the light emitting element, for example, a contact layer.

In further embodiments of the present invention, laser light is applied to the layer of semiconductor material using mask projection optics that applies the light in a predefined mask pattern to the layer of semiconductor material. The mask pattern is stepped to different regions of the layer of semiconductor material to provide a plurality of the three dimensional geometric patterns.

In particular embodiments of the present invention, the laser light includes light from an excimer laser operating at about 308 nm.

In some embodiments of the present invention, a plurality of geometric patterns are provided in the surface of the layer of semiconductor material. The geometric patterns extend into the substrate and have uninterrupted perimeters at a same level of the substrate. In further embodiments of the present invention, the surface of the substrate is on a side of the substrate opposite the light emitting element. The surface of the substrate may be on a same side of the substrate as the light emitting element. Shaping the surface of the substrate may precede singulation of the substrate into individual light emitting devices. Shaping the surface of the substrate may precede formation of the light emitting element on the substrate.

In particular embodiments of the present invention, the three dimensional geometric patterns include parabolic features. A plurality of different geometric patterns may also be generated in the surface of the layer of semiconductor material. The geometric patterns may also provide a curved substrate. In embodiments of the present invention where the layer of semiconductor material is the substrate, the substrate may be a silicon carbide substrate and/or a sapphire substrate. The geometric patterns may include lenses formed in the layer of semiconductor material. The geometric patterns could also be randomization features formed in the layer of semiconductor material. The geometric patterns could also be a sinusoidal pattern of grooves.

In further embodiments of the present invention, shaping a surface of the substrate utilizing a laser to define three dimensional geometric patterns in the layer of semiconductor material is provided by patterning a mask layer on the layer of semiconductor material using a laser, for example, to remove mask material and etching the layer of semiconductor material using the patterned mask layer to define the three dimensional geometric patterns. The mask may be a polymer mask. Patterning a mask layer on the semiconductor layer using a laser may also be provided by patterning a master template with a laser and embossing the mask layer using the master template.

In additional embodiments of the present invention, a microelectronic substrate is fabricated by removing material from the microelectronic substrate utilizing a laser to define three dimensional geometric light extraction patterns in the substrate. The substrate may also be etched subsequent to the removal of material utilizing a laser. The etch may be an anisotropic etch. The microelectronic substrate may be silicon carbide and/or sapphire. A light emitting element may be formed on the microelectronic substrate. The light emitting element may be formed after removal of the material from the substrate. In certain embodiments, the light emitting element is formed on a surface of the substrate having the three dimensional geometric patterns.

In additional embodiments of the present invention, a light emitting device includes a silicon carbide substrate having at least one surface having a three dimensional geometric pattern extending into the substrate from the at least one surface, the geometric pattern having at least one curved cross-section feature and having an uninterrupted periphery at the at least one surface. A light emitting element is provided on the substrate.

In certain embodiments of the present invention, the curved feature is a floor and/or sidewall of a region extending into the silicon carbide substrate. The curved feature may also be a portion of a perimeter of the feature. The curved feature may be a parabolic feature. The curved feature may provide a lens. The light emitting element may be provided on the at least one surface of the substrate. The light emitting element could also be provided on a surface of the substrate opposite the at least one surface of the substrate.

Further embodiments of the present invention provide a curved substrate.

In additional embodiments of the present invention, a light emitting device includes a substrate having at least one surface having a plurality of three dimensional geometric patterns therein, the plurality of geometric patterns including different geometric patterns and a light emitting element on the substrate. The light emitting element may be provided on the at least one surface of the substrate. The light emitting element may be provided on a surface of the substrate opposite the at least one surface of the substrate. The substrate may be a silicon carbide or a sapphire substrate.

Further embodiments of the present invention provide for shaping a surface of a silicon carbide substrate by patterning a mask layer on the silicon carbide substrate using a laser to remove mask material and etching the silicon carbide substrate using the patterned mask layer to define the three dimensional geometric patterns. The mask may be a polymer mask. A light emitting element may be formed on the substrate. The shape of the pattern of the mask layer may be based on a difference between an etch rate of the silicon carbide substrate and an etch rate of the mask layer.

In still further embodiments of the present invention, a micro-mask is formed between the mask layer and the silicon carbide substrate. The micro-mask is configured to roughen a surface of the substrate during etching. The micro-mask may include an aluminum layer between the mask layer and the substrate.

The three dimensional geometric patters may include a plurality of different geometric patterns. The plurality of different geometric patterns may be provided in a single etch and in a single patterning of the mask layer.

In yet other embodiments of the present invention, light extraction features are formed for a light emitting device having a substrate and a semiconductor light emitting element on the substrate by blanket annealing a surface of the substrate utilizing a laser to define three dimensional features in the substrate. Blanket annealing a surface of the substrate may include applying laser light to the substrate at an energy below an ablation threshold of the substrate. The surface of the substrate may be on a side of the substrate opposite the light emitting element. The substrate may be a silicon carbide substrate and/or a sapphire substrate.

Blanket annealing may include blanket annealing a first region of the substrate and then blanket annealing a second region of the substrate, different from the first region of the substrate. The resulting three-dimensional features may be in a substantially random pattern.

Further embodiments of the present invention provide a light emitting device, having a substrate having an agglomerated surface and a light emitting element on the substrate. In particular embodiments of the present invention, the substrate is a silicon carbide substrate. In some embodiments of the present invention, the substrate is a sapphire substrate.

In still further embodiments of the present invention, fabrication of a light emitting device having a substrate and a semiconductor light emitting element on the substrate, the light emitting element having a plurality of layers of semiconductor material includes patterning a surface of at least one of the layers of semiconductor material utilizing a laser. The at least one of the layers of semiconductor material may be a contact layer.

Patterning a surface may include applying laser light to the at least one layer of semiconductor material at an energy sufficient to remove material from the at least one layer of semiconductor material. Patterning a surface may include patterning a mask layer on the at least one layer of semiconductor material using a laser to remove mask material and etching the at least one layer of semiconductor material using the patterned mask layer. Patterning a surface may include laser blanket annealing a surface of at least one layer of semiconductor material. Laser blanket annealing may be carried out at an energy of less than an ablation threshold of the at least one layer of semiconductor material.

In additional embodiments of the present invention, a semiconductor device, includes a substrate and a semiconductor light emitting element on the substrate. The light emitting element includes a plurality of layers of semiconductor material and at least one of the layers of semiconductor material is patterned to provide light extraction features in the at least one of the layers of semiconductor material.

DETAILED DESCRIPTION

Figure 1:
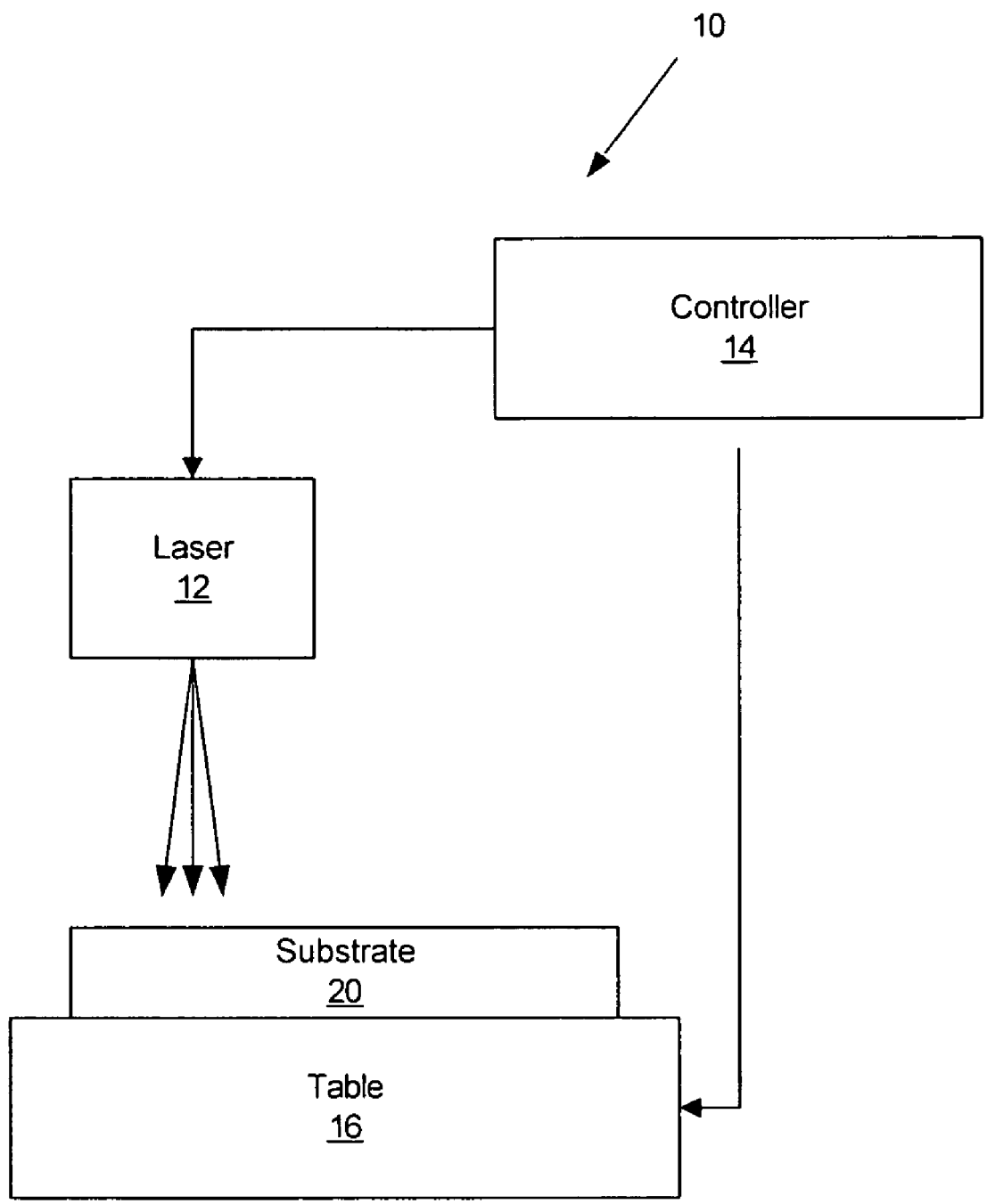
FIG. 1 is a block diagram of a system suitable for use in laser patterning according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second without departing from the teachings of the present invention.

Embodiments of the present invention provide methods for patterning of substrates for light emitting devices and such substrates. The patterning is provided utilizing a laser. The laser patterning may be provided in a single or step-wise fashion. By patterning a substrate, light extraction may be improved, for example, by providing a randomization pattern in the substrate. Embodiments of the present invention may be particularly well suited to larger area devices where the effectiveness of angled sidewalls of the substrate may be reduced because of the surface area of the device. Patterning of the substrate may occur before and/or after formation of the light emitting element on the substrate. Furthermore, one or both of the opposing faces of the substrate may be patterned. The face of the substrate that is patterned may be opposite the light emitting element or a face of the substrate on which the light emitting element is formed. Particular embodiments of the present invention provide for laser patterning of microelectronic substrates. As used herein, the term "microelectronic substrate" refers to a substrate of a material on which a microelectronic device may formed, as opposed to a substrate on which a device is subsequently attached.

The use of a laser may pattern a substrate without high mechanical forces as are present with sawing techniques. Furthermore, laser patterning may be more rapid than bevel cutting using a sawing system. Also, tapered features may be readily provided as the laser naturally produces such features as it penetrates the material. Feature depth may also be readily varied with use of a laser system.

FIG. 1 illustrates a laser patterning system 10 suitable for use in embodiments of the present invention. As seen in FIG. 1, a high power laser light source 12 is controlled by a controller 14 to provide a pattern of laser light on a microelectronic substrate 20 that is mounted on a table 16. The controller 14 controls the laser 12 and the table 16 to repeatedly apply the laser light to the substrate 20 so as to provide a three dimensional pattern in the substrate 20. In particular embodiments of the present invention, the three dimensional pattern provides a randomization pattern in the substrate 20. The three dimensional patterns may be symmetric or asymmetric. In some embodiments of the present invention, the three dimensional patterns are predefined patterns. In other embodiments of the present invention, the three dimensional patterns are not predefined.

The substrate 20 may be a singulated substrate of a device and/or may be a wafer including substrates of multiple devices prior to singulation. The pattern of laser light may be provided by mask projection optics and may be applied to the substrate 20 in a step and repeat sequence. Thus, the table 16 and/or the laser 12 may be moved on successive applications of the laser light to pattern different areas of the substrate. The mask pattern may be the same for each region of the substrate 20 or it may differ for different locations of the substrate 20. A galvo scanning system with a flat field lens could also be used to completely pattern the substrate without moving the substrate and/or wafer.

Subsequent to the application of the pattern of laser light, the substrate 20 may be etched to remove any light absorbing material generated by the laser process. An anisotropic etch, such as a reactive ion etch (RIE), may be used so as to maintain the morphology change induced by the laser. Alternatively, other etches known to those of skill in the art could be used if the pattern provided in the substrate by the laser takes into account the characteristics of the etch. For example, the etch may be an Inductively Coupled Plasma (ICP) etch or may be an isotropic etch. This etch may, for example, be provided as part of the fabrication process subsequent to a lapping operation and may precede formation of a contact on the substrate. For example, a 2 µm etch may be provided subsequent to lapping and patterning and prior to contact formation.

In particular embodiments of the present invention, the laser 12 is an excimer pulsed laser, however any laser system suitable for removing material from the substrate 20 may be used. For example, the laser system could be a frequency tripled and/or quadrpled YAG laser. In certain embodiments of the present invention, the laser 12 has a wavelength of 308 nm, however, other wavelengths, such as 248 nm, 193 nm, 157 nm, 355 nm or 266 nm could also be used. Additionally, assist processes known to those of skill in the art could also be employed to mitigate surface damage and/or enhance laser absorption, such as water mist and/or assist gases. Multiple pulses of the laser may be used to remove material from the substrate. Any energy suitable for controllably removing material from the substrate may be used. For example, a pulsed 308 nm laser of about 4.2 J/pulse may be used in certain embodiments of the present invention.

The substrate 20 may be any suitable substrate material. In particular embodiments of the present invention, the substrate 20 is a microelectronic substrate. For example, the substrate 20 may be a silicon carbide substrate, a sapphire substrate, a gallium nitride substrate or the like.

Figure 2:
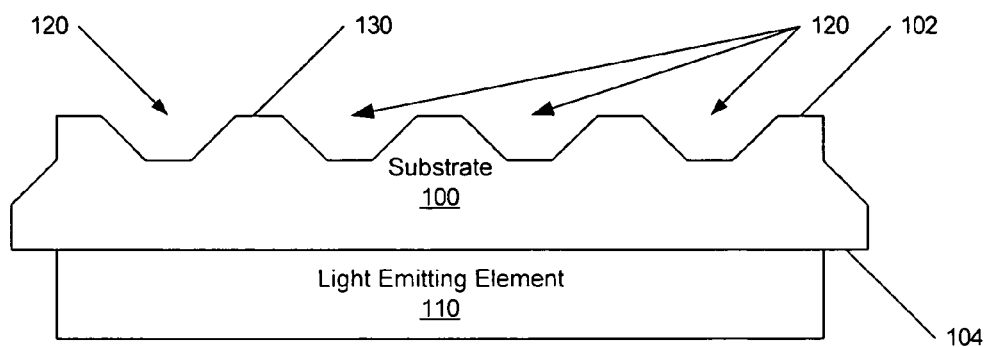
FIGS. 2 and 3 are a cross-sectional view and an isometric view of semiconductor light emitting device having a laser patterned substrate according to various embodiments of the present invention.
Figure 3:
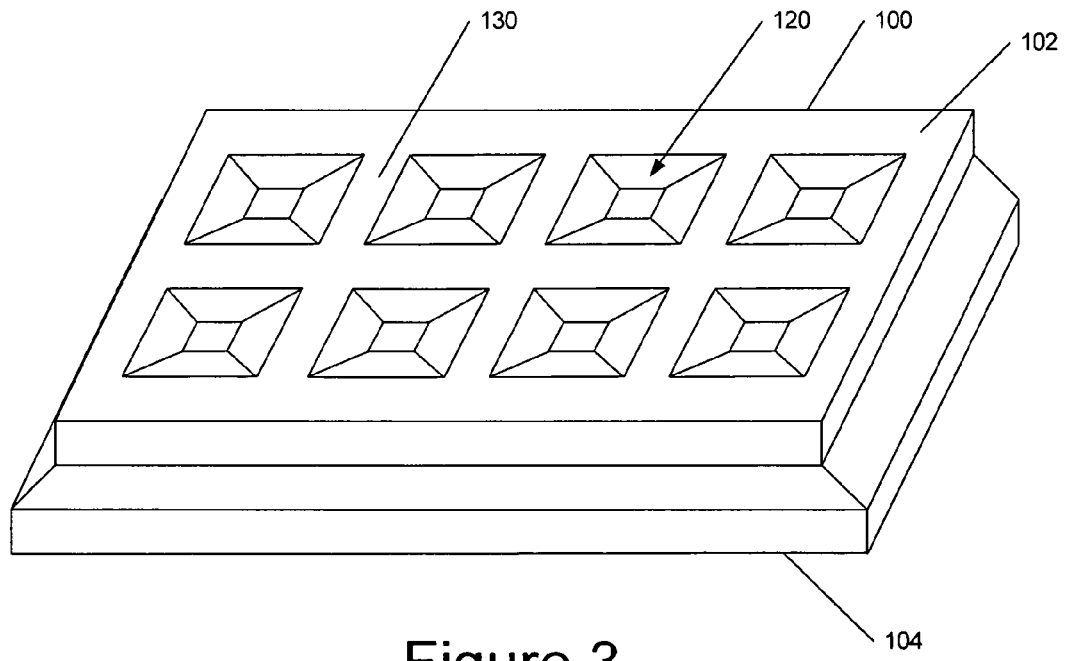

FIG. 2 is a cross-sectional view of a light emitting device that has been laser patterned according to embodiments of the present invention. FIG. 3 is an isometric pictorial view of the light emitting device of FIG. 2. As seen in FIG. 2, a substrate 100, such as the substrate 20 described above, has a light emitting element 110 formed thereon. Three dimensional patterns 120 are formed in a first surface 102 of the substrate 100 using a laser as described above with reference to FIG. 1. In the embodiments illustrated in FIGS. 2 and 3, the light emitting element 110 is formed on a second surface 104 of the substrate 100 opposite the first surface 102. As is seen in FIGS. 2 and 3, the patterns 120 are surrounded by an uninterrupted perimeter 130 at the first surface 102 of the substrate 100.

The semiconductor light emitting element 110 may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green LEDs may be provided. The design and fabrication of semiconductor light emitting devices are well known to those having skill in the art and need not be described in detail herein.

For example, the light emitting elements 110 may be gallium nitride-based LEDs or lasers fabricated on a silicon carbide substrate such as those devices manufactured and sold by Cree, Inc. of Durham, North Carolina. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled *Group III Nitride Based Light Emitting Diode Structures With a Quantum Well and Superlattice, Group III Nitride Based Quantum Well Structures and Group III Nitride Based Superlattice Structures*, published Jan. 9, 2003, as well as published U.S. Patent Publication No. US 2002/0123164 A1 entitled *Light Emitting Diodes Including Modifications for Light Extraction and Manufacturing Methods Therefor*. Furthermore, phosphor coated LEDs, such as those described in U.S. application Ser. No. 10/659,241, entitled *Phosphor-Coated Light Emitting Diodes Including Tapered Sidewalls and Fabrication Methods Therefor*, filed Sep. 9, 2003, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

Figure 4:
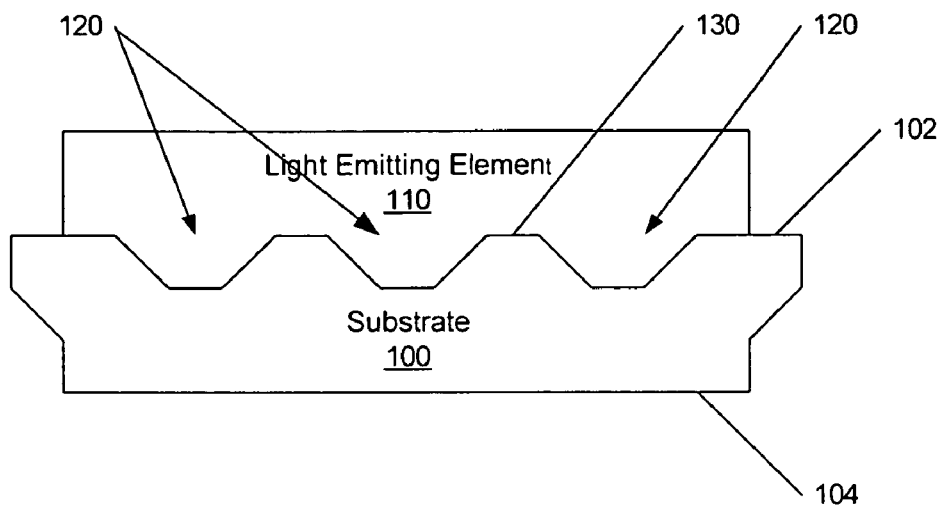
FIG. 4 is a cross-sectional view of a light emitting device having a laser patterned substrate according to further embodiments of the present invention.

FIG. 4 is a cross-sectional view of a light emitting device according to further embodiments of the present invention. As seen in FIG. 4, the light emitting element 110 may be formed on the patterned surface 102 of the substrate 100.

Figure 5:
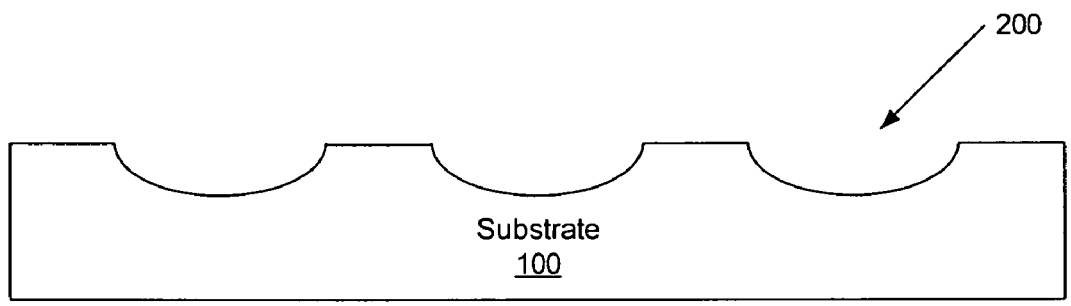
FIGS. 5 through 8 are cross-sectional views of laser patterned substrates according to alternative embodiments of the present invention.
Figure 6:
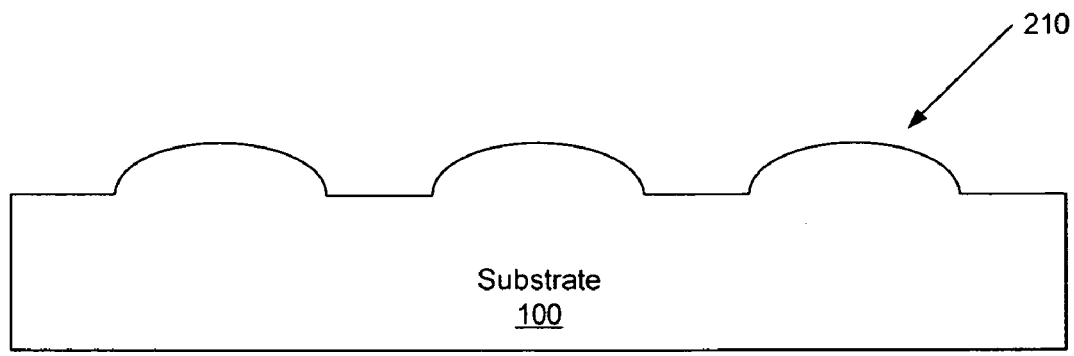

FIGS. 5 and 6 are a cross-sectional views of substrates 100 according to further embodiments of the present invention. As seen in FIGS. 5 and 6, in cross-section, curved surfaces extending into 200 or protruding 210 from the substrate 100 may be provided by laser patterning. The curved surfaces 200, 210 may include a parabolic curve. Such a curve may be provided, for example, by controlling the laser light using a series of masks that provided the selective removal of substrate material to provide the parabolic structures. In certain embodiments of the present invention, the curved surfaces may provide lenses in the substrate. In other embodiments of the present invention, the curved surfaces may provide a sinusoidal pattern of grooves.

While multiple curved structures are illustrated in FIGS. 5 and 6, the substrate could be shaped to a single curve so as to provide a curved substrate. The curved substrate may be provided on one or both of the faces of the substrate. Also, the light emitting element could be provided on the curved surface of the substrate.

Figure 7:
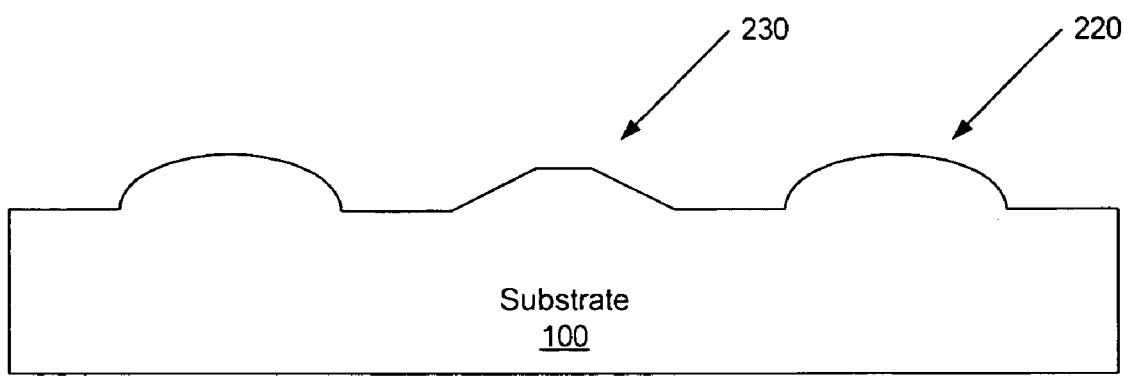
Figure 8:
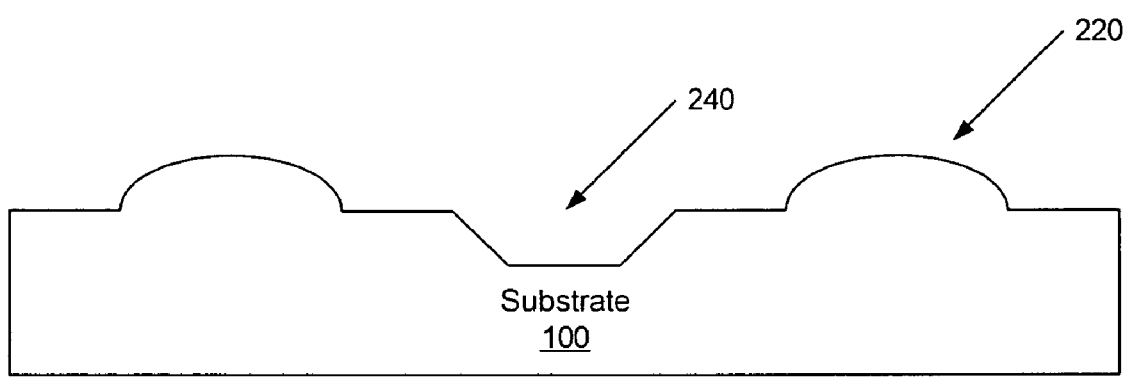

FIGS. 7 and 8 are cross-sectional views of substrates 100 according to further embodiments of the present invention. As seen in FIGS. 7 and 8, combinations of curved 220 and non-curved features 230, 240 may be provided in a single substrate 100. Thus, embodiments of the present invention may include multiple different three dimensional geometric patterns in a single substrate.

Figure 9:
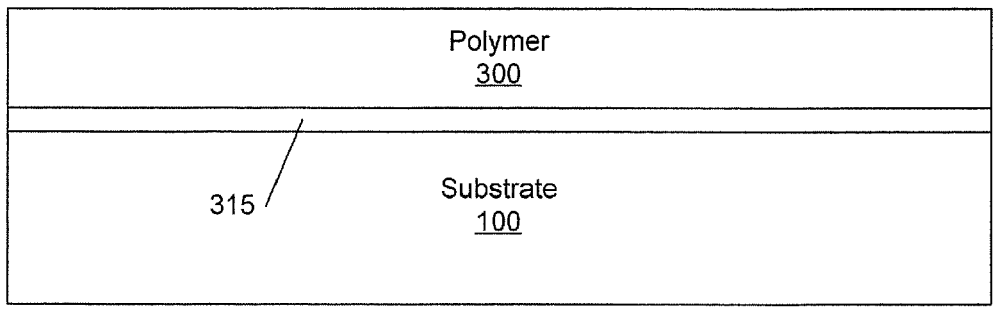
FIGS. 9 through 11 are cross-sectional view illustrating operations according to laser patterning techniques according to alternative embodiments of the present invention.
Figure 10:
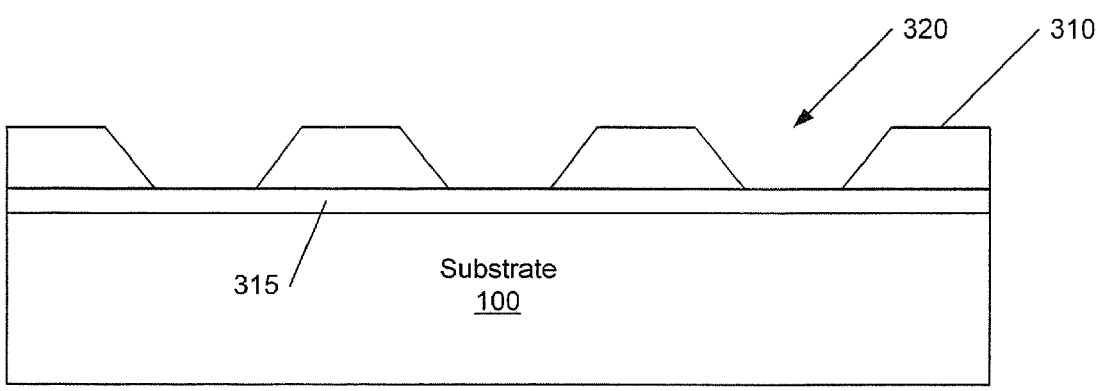
Figure 11:
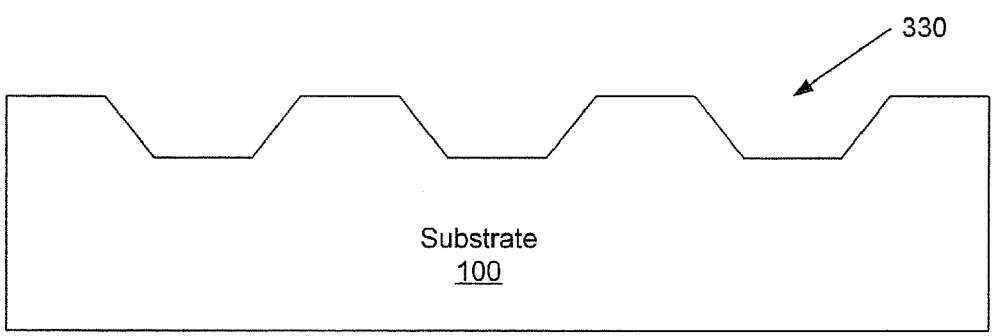

FIGS. 9 through 11 illustrate alternative embodiments for laser patterning according to embodiments of the present invention. As seen in FIG. 9, a polymer mask layer 300 may be provided on the substrate 100. In FIG. 10, the polymer mask layer 300 is laser patterned to provide a polymer mask 310 having three dimensional features 320 corresponding to features to be provided in the substrate 100. In FIG. 11, the mask 310 is used as an etch mask and the substrate 100 is etched to provide the three dimensional features 330. The etch may, for example, be a dry etch. Conventional polymer masks and techniques for etching using polymer masks may be used. Additionally, other mask materials that may be laser patterned could also be used.

Techniques for laser patterning a polymer layer are known to those of skill in the art. For example, such techniques are described in "Laser micro-machining of high density optical structures on large substrates" by Boehlen et al. of Exitech Ltd. In particular embodiments of the present invention, where the etching mask is a polymer etching mask, the polymer may be patterned with a 248 nm laser. Characteristics of the etching process may be taken into account in designing the characteristics of the mask 310 to provide a desired three dimensional geometric pattern in the substrate 100. For example, the differences in etch rate between the mask material and the silicon carbide substrate may be taken into account when the mask is patterned. Because the patterning of the etching mask is provided for by laser patterning, the shape of the etching mask may be readily adjusted through control of the laser mask. Thus, for example, the shape of the etching mask may take into account the 6 to 1 etching rate of the etching mask to the silicon carbide and the features adjusted accordingly. Such an adjustment of mask characteristics may be difficult to provide without the use of laser patterning of the etching mask. Furthermore, through utilization of laser patterning, multiple geometries, e.g., pyramids and lenses, can be formed in a single step with scanning image technique by designing them into the laser mask.

Additionally, the surface of the substrate after the etch may be rough or smooth. A roughened surface may be provided, for example, by placing a thin layer of material, such as aluminum, between the etch mask and the substrate to create a micro-mask 315. When etched, the micro-mask 315 may act to roughen the surface of the substrate.

Figure 12A:
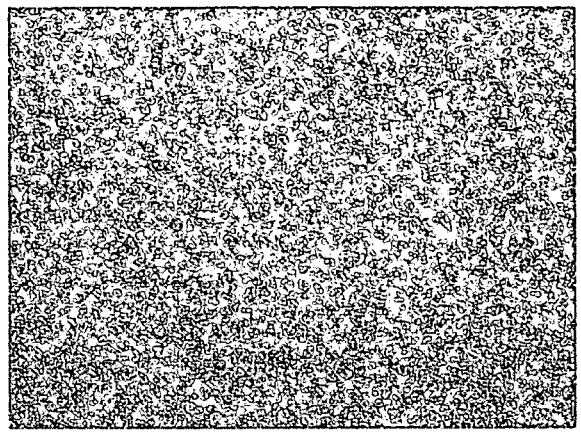
FIGS. 12A-12C are SEM images of a portion of a silicon carbide substrate processed according to further embodiments of the present invention.
Figure 12B:
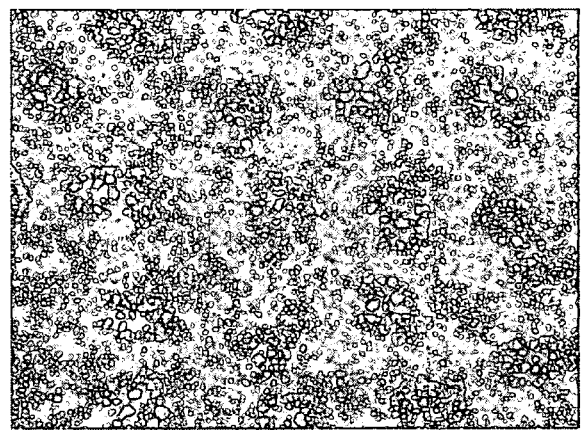
Figure 12C:
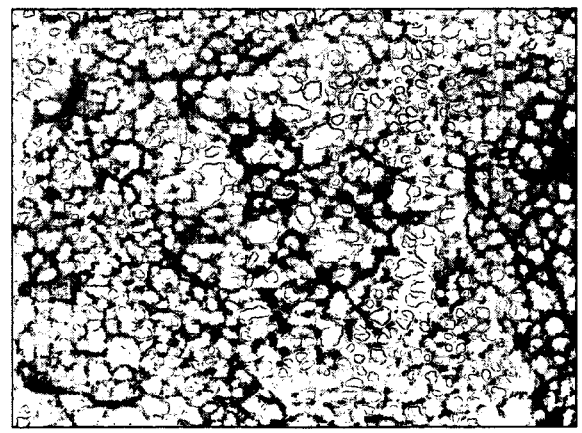

FIGS. 12A-12C are SEM images of a portion of a silicon carbide substrate processed according to further embodiments of the present invention. FIG. 12A reflects approximately a 50 µm portion of a silicon carbide substrate. FIG. 12B reflects approximately a 5 µm portion of the silicon carbide substrate. FIG. 12C reflects approximately a 1 µm portion of the silicon carbide substrate.

The silicon carbide substrate illustrated in FIGS. 12A-12C was processed with a blanket laser anneal of the surface of the substrate to provide a randomizing pattern. The blanket laser anneal provides a substantially uniform exposure of the substrate to the laser light. The substrate may be covered in a step and repeat manner so that only a portion of the substrate is exposed to the blanket anneal at a given time. The energy of the laser should below the ablation threshold of silicon carbide. In the particular example of the blanket laser patterning illustrated in FIGS. 12A-C, the sample was irradiated in 1 mm by 1 mm steps with a 248 nm laser at approximately 2 J/cm$^2$ using a water assist. However, other wavelengths and/or energies may be utilized.

As seen in FIGS. 12A-C, a blanket exposure may provided randomizing features in the silicon carbide substrate. The features resulting from a blanket exposure of the substrate are, typically, not predefined but may provide a substantially random arrangement of resulting features. Furthermore, as seen in FIGS. 12A-C, an agglomerated surface of the substrate may be provided. As discussed above, such features may provided for improved light extraction from the substrate. For example, light output for the devices of FIGS. 12A-C increased by about 13% to 15% over a control with no blanket anneal.

Figure 13:
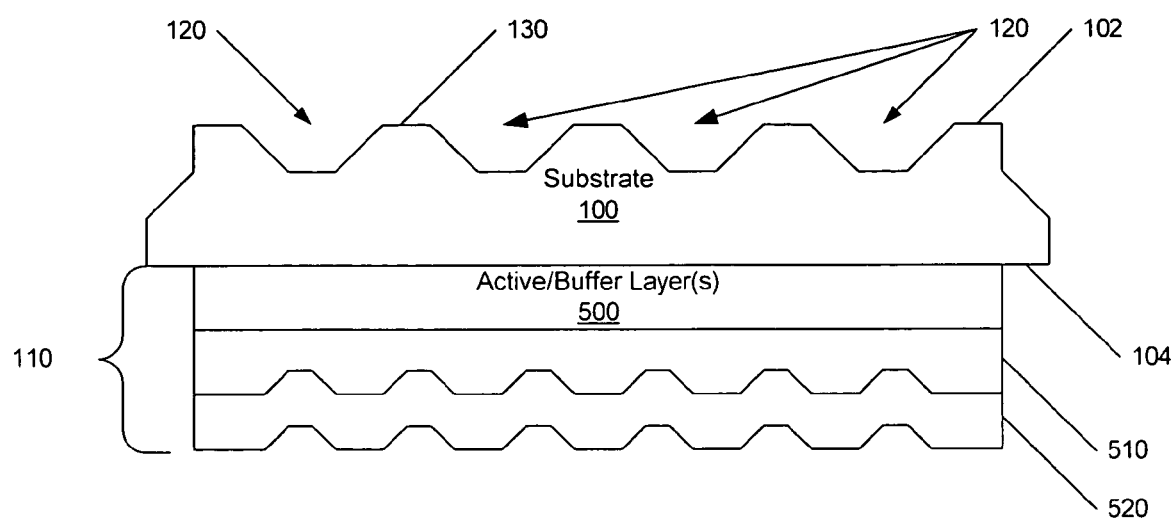
FIG. 13 is a cross-sectional view of a light emitting device according to further embodiments of the present invention.

Embodiments of the present invention have been described above with reference to the laser patterning of a substrate of a light emitting device. However, embodiments of the present invention may also be suitable in patterning epitaxial layers or other layers of the light emitting device, such as contact layers or the like. Thus, FIG. 13 illustrates a light emitting device having a laser patterned epitaxial layer. As seen in FIG. 13, the light emitting device may have a light emitting element 110 that includes one or more active/buffer layers 500, a layer of semiconductor material 510 and a contact 520. The layer of semiconductor material 510 is patterned as described above with reference to the substrate 100 and may be patterned by direct removal of material and/or formation of a mask and etching as described above with reference to FIGS. 1-11. The layer of semiconductor material may be, for example, a contact layer, such as a p-type GaN contact layer. A contact 520 is provided on the layer of semiconductor material 510 and may be conformal with the layer of semiconductor material 510 such that the pattern of the layer of semiconductor material is translated to a surface of the contact 520. The contact 520 could also be patterned, for example using a laser as described above with reference to the substrates of FIGS. 1-11.

While FIG. 13 illustrated a predefined pattern in the layer of semiconductor material 510, light extraction features could also be created as described above with reference to FIGS. 12A-C through the use of a blanket anneal with a laser. Furthermore, FIG. 13 illustrates both substrate and semiconductor layer feature creation, however, embodiments of the present invention include feature creation in a semiconductor layer without creation of features in the substrate. Furthermore, other layers of the light emitting device could also or alternatively have features created utilizing a laser. Thus, for example, the active/buffer layer(s) 500 could also or alternatively have laser created features.

Embodiments of the present invention have been described with reference to the laser removing material of a mask layer so as to pattern the mask that is subsequently used for etching. Alternatively or additionally the laser may be used to remove material from a master that is then used to emboss/replicate a pattern in a mask on a layer of semiconductor material. The pattern formed in the master may, for example, be a negative of the pattern for the mask. The mask material may, as described above, be a polymer material and may, be heat curable or otherwise settable after the pattern is impressed in the mask material with the master. The master may be any material sufficiently strong to act as an embossing template, that does not adversely react with the mask material, and that may be laser patterned.

The following examples are provided for illustrative purposes and are not intended to limit the scope of the present invention.

EXAMPLES

An excimer laser operating at 308 nm and using mask projection optics that project a 2 mm×2 mm field was used on a wafer. Using a step and repeat sequence, geometric patterns were laser scribed into the backside of a SiC LED wafer approximately 1 μm deep using 5 pulses at approximately 4.2 J/pulse. Ground control regions were left between the laser scribed regions of the wafer. Subsequent to the laser process, the wafers were aggressively etched in a RIE tool to remove any light absorbing material generated by the laser process. Because the RIE process is anisotropic, the morphology change induced by the laser was maintained. Initial test patterns were 10 μm squares, 15 μm circles, 20 μm crosses and 20 μm stars. Die from the square patterned areas showed the largest increase in light output versus die from the control region. Approximately a 20% increase was provided by a double pass interleaved square pattern over the die from the control regions.

Figure 14A:
FIGS. 14A and 15A are images of polymer masks according to some embodiments of the present invention.
Figure 14B:
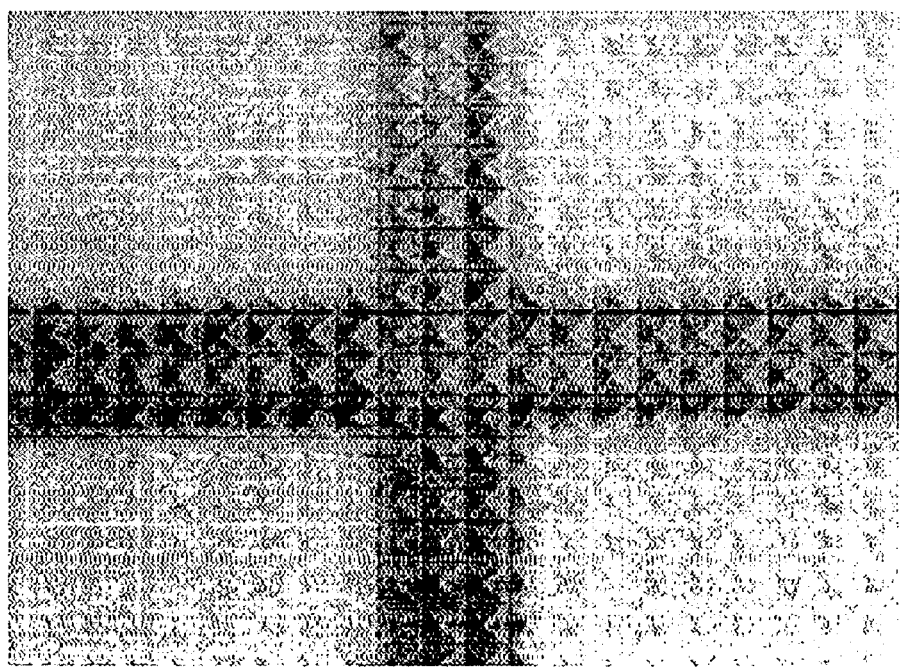
Figure 15A:
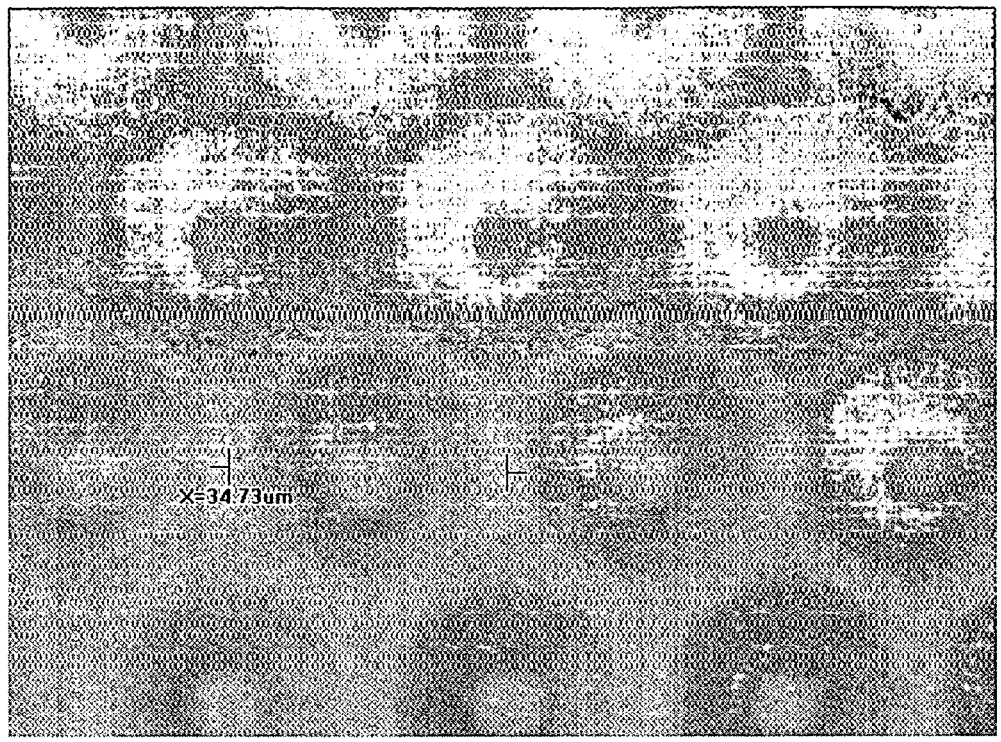
Figure 15B:
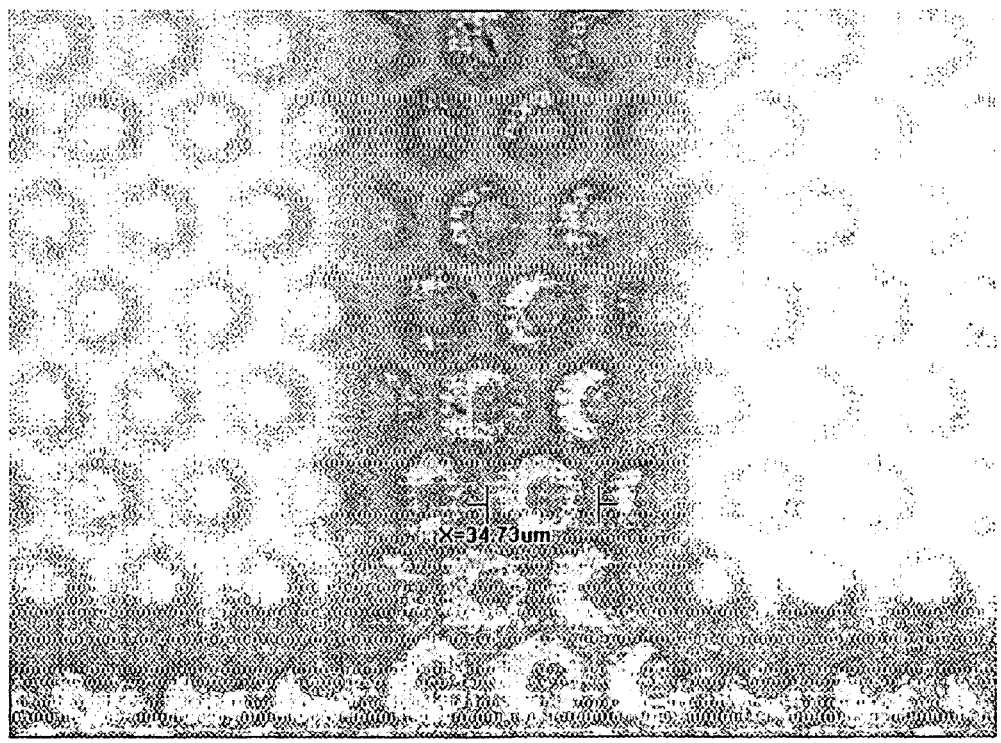
FIGS. 15B and 15B are images of substrates etched suing the polymer masks of FIGS. 13A and 14A.

FIGS. 14A and 15A are images of polymer masks that were used in the pattern and etch process described above with reference to FIGS. 9-11. FIG. 14A provides a plurality of asymmetric pyramids and FIG. 15A provides a plurality of micro-lenses. In FIG. 15A, the mask provided a flat surface as part of the lense, however, with less depth of removal, the flat surface may be eliminated and/or reduced. FIGS. 14B and 15B are images of the silicon carbide substrates after etching using the corresponding mask of FIGS. 14A and 15A. As seen in FIGS. 14B and 15B, the etch mask geometry has translated to the silicon carbide substrate.

It will be understood by those having skill in the art that various embodiments of the invention have been described individually in connection with FIGS. 1-15B. However, combinations and subcombinations of the embodiments of FIGS. 1-15B may be provided according to various embodiments of the present invention. Furthermore, embodiments of the present invention have been described with reference to particular three dimensional patterns, however, other three dimensional patterns may be used while still benefiting from the teachings of the present invention.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of shaping a surface of a silicon carbide substrate, comprising:
   patterning a mask layer on the silicon carbide substrate using a laser to remove material from the mask layer, wherein patterning the mask layer comprises applying laser light to the mask layer at an energy sufficient to remove material from the mask layer while scanning a pattern into the mask layer to form three dimensional geometric patterns in the mask layer; and
   etching the silicon carbide substrate using the patterned mask layer to define the three dimensional geometric patterns, wherein the three dimensional geometric patterns comprise a plurality of different geometric patterns.

2. The method of claim 1, wherein the mask is a polymer mask.

3. The method of claim 1, further comprising forming a light emitting element on the substrate.

4. The method of claim 1, wherein a shape of the three dimensional geometric patterns of the mask layer is based on a difference between an etch rate of the silicon carbide substrate and an etch rate of the mask layer.

5. The method of claim 1, further comprising forming a micro-mask between the mask layer and the silicon carbide substrate, the micro-mask being configured to roughen a surface of the substrate during the etching.

6. The method of claim 5, wherein the micro-mask comprises an aluminum layer between the mask layer and the substrate.

7. The method of claim 1, wherein the plurality of different geometric patterns are provided in a single etch and in a single patterning of the mask layer.

8. The method of claim 7, wherein the plurality of different geometric patterns comprise surfaces that are angled with respect to the surface of the silicon carbide substrate.

9. A method of shaping a surface of a silicon carbide substrate, comprising:

forming a mask layer on the surface of the silicon carbide substrate;

patterning the mask layer using a laser to remove material from the mask layer, wherein patterning the mask layer comprises scanning laser light onto the mask layer at an energy sufficient to remove material from the mask layer to form three-dimensional geometric features in the mask layer having sidewalls that are angled relative to the surface of the substrate; and anisotropically etching the silicon carbide substrate using the patterned mask layer to define the three dimensional geometric patterns having sidewalls that are angled relative to the surface of the substrate.

* * * * *